United States Patent [19]
Mouissie

[11] Patent Number: 4,749,368
[45] Date of Patent: Jun. 7, 1988

[54] CONTACT STRIP TERMINAL

[75] Inventor: Bob Mouissie, EK Berlicum, Netherlands

[73] Assignee: E. I. Du Pont de Nemours and Company, Wilmington, Del.

[21] Appl. No.: 31,795

[22] Filed: May 19, 1987

[30] Foreign Application Priority Data

Apr. 4, 1986 [NL] Netherlands ................. 8600856
Aug. 19, 1986 [DE] Fed. Rep. of Germany ....... 8622143

[51] Int. Cl.⁴ ............................................. H01R 4/24
[52] U.S. Cl. ...................................................... 439/421
[58] Field of Search ................................ 439/421–424

[56] References Cited

U.S. PATENT DOCUMENTS

| | | | |
|---|---|---|---|
| 3,197,729 | 7/1965 | Sarazen | 339/97 |
| 3,798,347 | 3/1974 | Harding et al. | 339/97 |
| 3,891,293 | 6/1975 | Jones | 339/95 |
| 3,902,004 | 8/1975 | Harding et al. | 339/98 |
| 4,082,402 | 4/1978 | Kinkaid et al. | 339/97 |

FOREIGN PATENT DOCUMENTS 2122159 1/1972 France.
2234677 6/1974 France.

Primary Examiner—Joseph H. McGlynn

[57] ABSTRACT

A contact strip for the electrical connection of at least one flat conductor of a flexible conductor film, which contact strip comprises a strip-type base part of electrically conducting material and at least one group of teeth projecting outwards from a surface of the base part, for cutting through the flexible conductor film and contacting the conductor while the teeth can be deformed in the direction of the base part to press the base part. According to the present invention the base part comprises at least a second group of teeth projecting outwards from the surface of the base part, in which the first and second group of teeth are positioned within the periphery of the strip-type base part. All teeth of a group are arranged in a closed peripheral line such as circle, ellipse, triangle, square or other geometrical polygon and the distance between these teeth is smaller than the smallest dimension of the flat conductor to be contacted. Each group of teeth preferably consists of four pointed, triangular teeth.

11 Claims, 7 Drawing Sheets

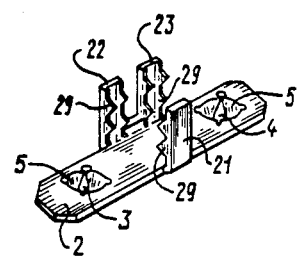
fig-10
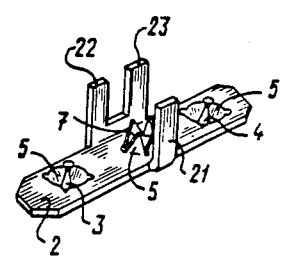
fig-11
fig-12
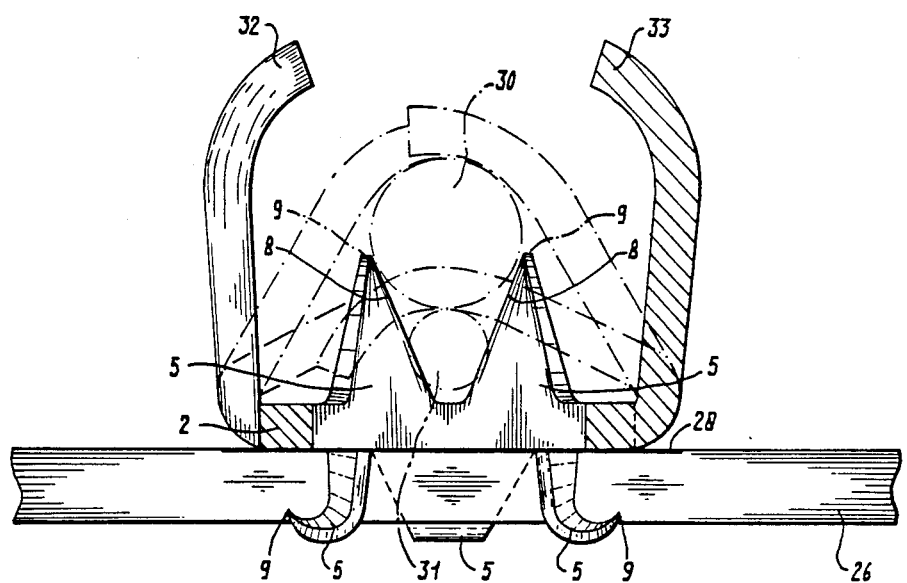

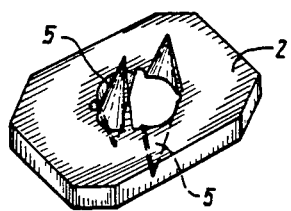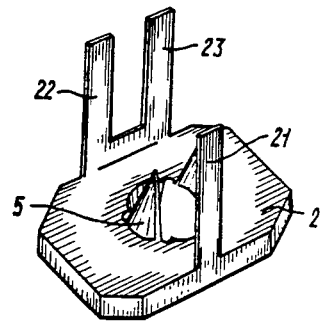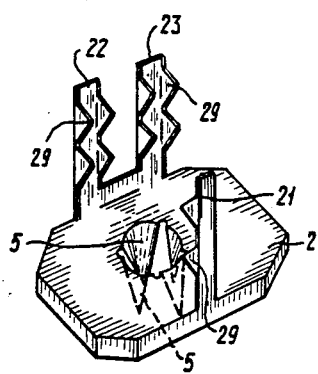

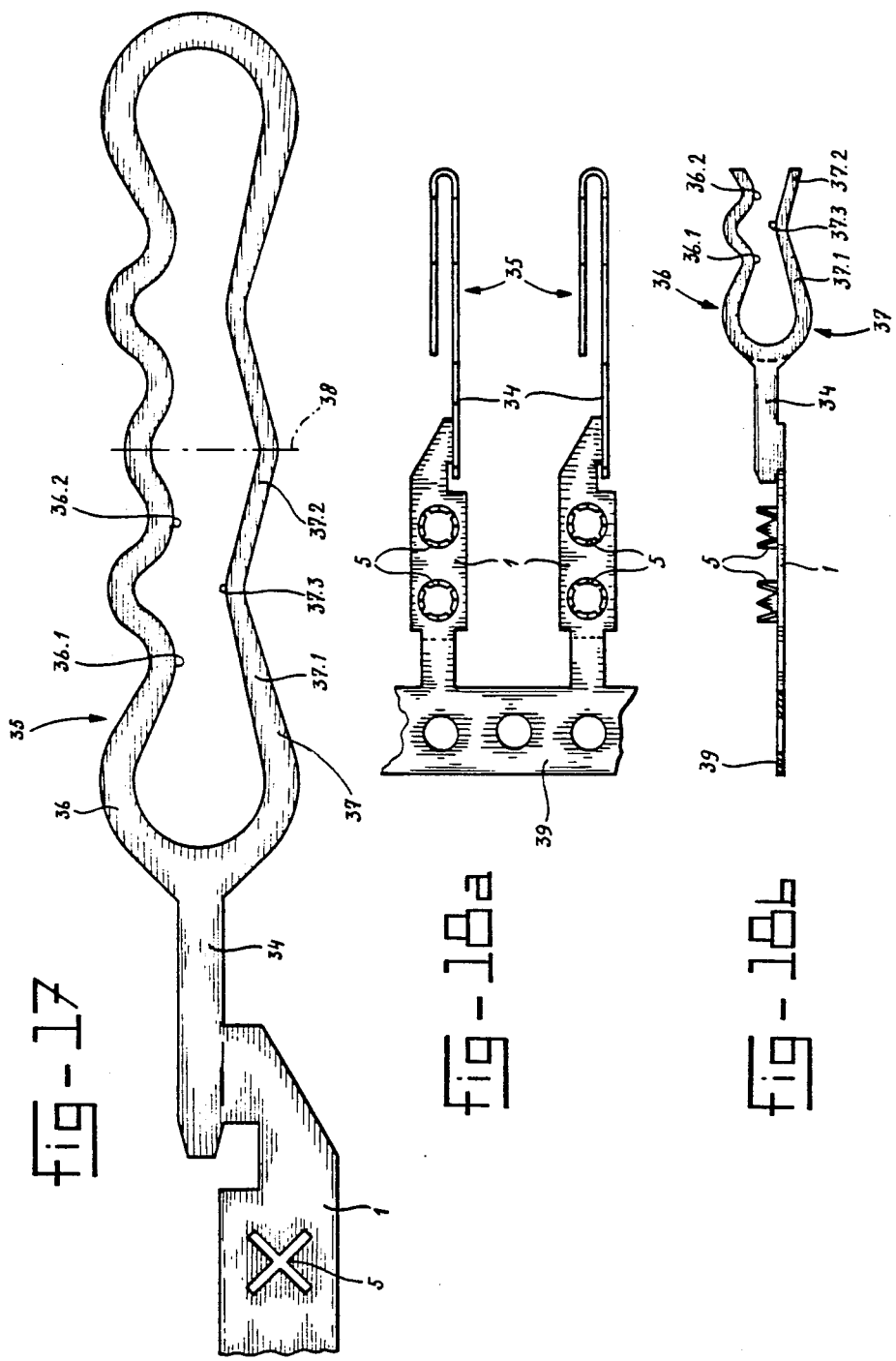

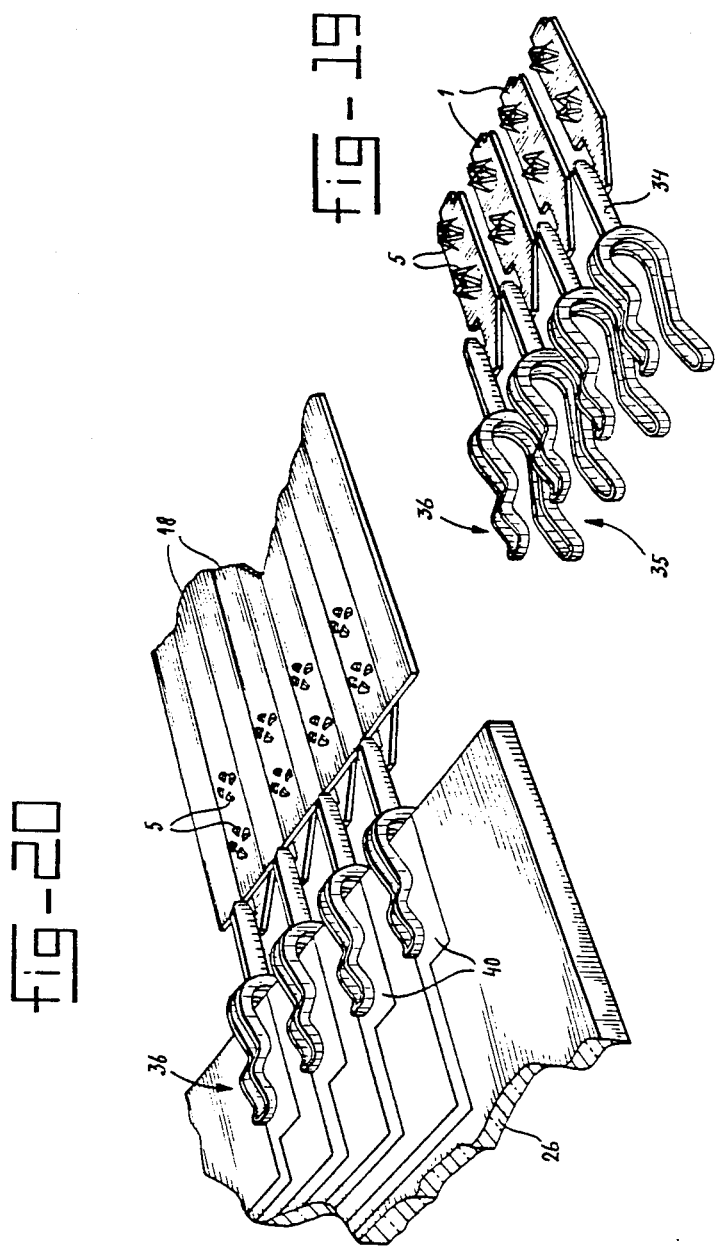

CONTACT STRIP TERMINAL

BACKGROUND OF THE INVENTION

The invention relates to a terminal for the electrical connection of a flat conductor and, in particular, to a contact strip for a flat conductor of a flexible conductor film.

A terminal for flat conductor cable is disclosed by U.S. Pat. No. 4,082,402 issued Apr. 4, 1978 to Kinkaid et al. Flat electrical cables such as ribbon cable or flexible conductor film are generally known and have been in use for several years now, principally for connection purposes. The term "flexible conductor film" is generally used for a polyester film serving as a carrier, with a copper layer applied thereto, which is etched to form a combination of several parallel conducting strips or a printed circuit board. Over the etched copper it is also possible to apply one or more electrically insulating flexible protection layers, with the object of protecting the conducting strips against undesired contacting, damage, oxidation through the effects of damp etc.

The use of flexible conductor film as wiring for electrical circuits, particularly in automobile technology, is reaching ever-increasing proportions. Flexible conductor film permits, on the one hand, a saving of space and weight compared with other wiring techniques and, on the other, a considerable simplification of the generally complex wiring to electrical instruments, lighting and electronic components.

In practice, it is therefore necessary to be able to produce interconnection in a simple manner at any desired points on the film for the purpose of accommodating electrical components (resistors, capacitors, diodes etc.) on the flexible conductor film, but also in order to connect the conductors of one flexible conductor film in a simple manner to conductors of other flexible conductor film, signal wires, bridging wires etc.

For this purpose, various devices are known, but they are mainly designed for the connection of conductors of a flexible conductor film which is provided with a specific wiring pattern. Part of the insulation also generally has to be removed from the conductors to be contacted, which is a relatively labour-intensive, time-consuming and therefore quite expensive operation, which is also less suitable for the connection of the conductors by automatic means.

Another disadvantage is that the places where the insulation is removed are readily accessible to the effects of damp, which can cause oxidation and in the long run does not benefit the reliability of the connections. In automobile technology, such connections are therefore highly undesirable. The connection of the conductors by means of soldered connections also adversely affects the flexibility of the film.

The terminal of the aforenoted U.S. Pat. No. 4,082,402 has the advantage that in this case no insulation material need be removed from the conductor. The pointed projecting teeth of this terminal, which are situated opposite each other, can penetrate first on either side of the conductor through the insulation and then, if necessary, through the conductor, following which they are bent over backwards in such a way that mainly the pointed ends of these teeth produce an electrical connection with the conductor. Since the distance between opposite teeth is slightly smaller that the width of the conductor, the conductor will in general undergo a considerable deformation on its edges.

Because the teeth in this terminal lie along the edges of the contact strip on either side of the elongated conductor, this configuration is not suitable for use as a contact strip for connecting two conductors forming arbitrary angles with each other. For, a separate contact strip will always be needed for each angular position, in such a way that the teeth always lie on either side of the conductor.

Due to the fact that the conductor is enclosed between the teeth, the same terminal is also less suitable for contacting conductors of various widths. For, in the case of a narrower conductor and relatively long teeth, the pointed ends of the teeth can be bent past the edge of this conductor, as a result of which no contact is made with the conductor. In the case of broad conductors, it can, on the other hand, happen that the teeth are not strong enough to penetrate through the copper layer of the conductor film, which offers relatively more mechanical resistance.

SUMMARY OF THE INVENTION

In view of the above disadvantages, the object of the present invention is to produce a contact strip by means of which flat conductors can be connected in a simple manner at any desired angles, in particular at any desired points of a flexible conductor film. The contact strip according to the invention is to this end characterized in that the base part comprises at least a second group of teeth projecting outwards relative to a surface of the base part, and the first and second group of teeth are placed within the periphery of the strip-type base part, while all teeth of a group are arranged in a closed peripheral line, and the distance between them is smaller than the smallest dimension of the flat conductor to be contacted. Arranged in a closed peripheral line means that all teeth of a group along their ends fixed on the strip-type base part can be enclosed by a circle, ellipse, triangle, square or other geometrical polygon.

A preferred embodiment of the contact strip according to the invention is characterized in that the groups of teeth are displaced in the longitudinal direction of the base part over a distance which is at least equal to the smallest distance between adjacent conductors of a flexible conductor film.

The second group of teeth can project outwards in the same direction as the first group of teeth, which makes the contact strip particularly suitable for inter-connection of conductors on the same flexible conductor film.

The second group of teeth can, however, also project outwards in the opposite direction to that of the first group of teeth, with means that the contact strip can be used, for example, for inter-connection of conductors of two flexible conductor films one lying above the other.

A preferred embodiment of the invention, which is particularly suitable for the connection of flexible conductor films with several parallel conductors, is characterized in that disposed between the first and the second groups of teeth projecting in one direction is a third group of teeth which projects in the opposite direction to that of the first and second groups of teeth.

Through the universal way in which with the contact strip according to the invention arbitrarily placed conductors of a flexible conductor film can be connected, considerable cost savings can be achieved in practice in applications where otherwise a so-called flexible conductor film with tracks on both sides would have to be used, in other words, a flexible conductor film on both sides of which two copper layers or the like which are separate from each other are etched according to a particular wiring pattern. It is, in fact, cheaper to connect together at predetermined points conductors of two flexible conductor films wired on one side, using contact strips according to the invention, than it is to develop and produce a circuit wired on both sides, where in the end conductors of the two surfaces also have to be connected together at predetermined points. It will be clear, however, that in this last case contact strips according to the invention can also advantageously be used.

In addition to the interconnection of the conductors of one or more flexible conductor films, it may—as mentioned above—also be necessary for electronic components to be accomodated in a circuit, for example between two conductors of a film. For this, it is also possible to use the contact strip according to the invention, in which case then on at least one long side of the base part provision is made for at least one outward projecting lip which is deformable in the direction of the base part for clamping a connecting wire between the base part and the lip. It will be clear that in this way bridging wires, signal wires and the like can also be connected to the conductors of the film.

Another preferred embodiment of the contact strip according to the invention is characterized in that on either side of the base part provision is made for lips which are deformable in the direction of the base part and project outwards in the same direction for clamping a connecting wire between the base part and said lips, with one lip being disposed on one long side and two lips being disposed on the other long side, said lips having such dimensions that, after bending, the lips adjoin one another.

In order to permit the connection of connecting wires of differing thicknesses or to prevent tolerances in the thickness of identical connecting wires from affecting the quality of the connections, these lips are preferably provided at the level of the third group of teeth and project in the same direction as said teeth, so that, after bending over, the lips adjoin each other and the connecting wire is contacted by the third group of teeth and is confined firmly between them.

The clamping action achieved in this way guarantees a reliable, good-quality connection, without the need for the insulation around a connecting wire to be contacted having to be removed, because it can be cut through by sharp edges of the teeth.

A good clamping action can also be obtained by providing the outward projecting lips of the contact strip with several pointed sharp projections, in such a way that, after bending over of the lips, said projections are directed towards a surface of the base part for contacting and clamping of the connecting wire.

Each group of teeth preferably consists of four pointed, tri-angular teeth arranged in a circle relative to one another, with sharp edges, and with the teeth having such dimensions that, after bending over, they do not extend beyond the periphery of the contacted conductor. This prevents the bent-over teeth from producing an undesired connection between adjacent conductors.

The contact strip according to the invention can advantageously be stamped out of a strip of electrically conducting material. Precisely because no particular preworking or finishing operations are needed for applying or finishing off the contact strip according to the invention, this strip provides excellent possibilities for mechanical positioning at any desired angles relative to the conductors and over the entire surface of a flexible conductor film. For this purpose, it is an advantage to stamp a continuous series of contact strips from a strip of electrically conducting material, and these can then be fixed individually to the film.

In addition to mechanical processing, the contact strips can, of course, also be placed on the film by hand, preferably using suitable equipment for the purpose.

The invention also relates to an edge clip connector for interconnecting the contact strip of the present invention with the edge of a substrate, for connecting this substrate with a flat flexible connector.

In general known edge clip connectors used for connection with the contact faces of a substrate, such as a LCD substrate, are held in place by means of plastic holders. Most of these known edge clip connectors have to be fixed to the printed circuits of the substrate by means of a soldered joint. These constructions in terms of dimensions are such that there can be no question of a compact design. The construction is also such that only a single contact point rests with a contact force on the contact faces of the substrate, while there is a spring action which is largely determined by the geometric dimensions of this type of contact. As a result of this construction, the known edge clip connectors have to be placed in a plastic carrier to ensure that they do not flip over before they are plugged onto the substrate and possibly soldered.

Therefore it is a further object of the present invention to eliminate the above-mentioned problems and to provide an edge clip connector for a contact strip, the base part of which comprises several groups of teeth, placed within the periphery of the strip-type base part, and in which each group preferably comprise four pointed triangular teeth with sharp edges arranged in a circle and in which the teeth are provided with sharp edges for contacting the conductors; in which both the spring action and the connector opening of the clip connector contacts are reproducible.

This is thus achieved according to the present invention in that the edge clip connector consists of an assembly obtained in one stamping operation from a flat sheet of resilient metal and comprising said contact strip, a stem strip and a clip contact in the form of a closed flat loop strip which at one end passes into the stem strip and which is bent about the symmetrical transverse axis, so that the legs of the two halves of the loop come to rest adjacent to each other and together define an approximately U-shaped clip opening on either side.

In an advantageous embodiment of this edge clip one leg of each half of the loop is a meander shape with at least two inward-directed supporting bracket contact points, and the other leg is a slight V-shape, whose top is directed inwards and opposite the bend lying between the two supporting bracket contact points of the one leg, so that the substrate in question can be inserted parallel to the outward-projecting leg part of the other leg at an angle to the longitudinal direction of the clip contact until its edge lies in the said bend of the one leg and subsequently can be introduced with lever action on the V-shape of the other leg along the longitudinal direction up to the closed end of the two halves of the loop.

Preferably the contact strip is bend perpendicularly with respect to the longitudinal axis of the clip connector for interconnection with a separate flexible conductor.

The invention also relates to a process for the production of the above-mentioned row of edge clip connectors or a single edge clip connector. Here the edge clip connectors are stamped out of a flat sheet of resilient metal and by means of a stem strip are held firmly on a carrier strip made from the sheet, while after the stamping operation the closed flat loop strip thus obtained is bent about the symmetrical transverse axis, and the stem strip with the belonging clip contact is bent over at right angles relative to the contact strip.

In this embodiment according to the process the reproducibility both of the spring action and of the clip opening of the edge clip connectors is amply ensured, since production of this row of above-mentioned contacts is determined by the stamping precision and not, as in the case of the hitherto known edge clip connectors, by the folding precision thereof. The edge clip connectors can be separated from the carrier strip in the known way.

The shape of the above-mentioned closed loop strip is selected in such a way that if this flat loop strip is bent about its central transverse axis from it original plane, an approximately U-shaped or jaw-shaped clip opening of the connector is obtained. Since the ends of each half of the loop, which have now come to rest adjacent to each other, form an approximately obtuse angle, a self-centring action of the edge clip connector is obtained when it is fitted on the edge of a substrate.

This row of edge clip connectors has great dimensional stability, which is largely determined by the precision of the stamping. The U-shaped connector opening is very stable and cannot flip over, essentially due to the double design of the U-shaped jaw. Since one leg of the connector has two supporting bracket contact points and the other V-shaped leg has one contact point, on gripping of the substrate a definite contacting will be obtained, with resulting greater reliability.

Since the connection edges of substrates, which are currently often of glass, are very sharp, the embodiment according to the invention results in a shape which will prevent damage of the contact point through these sharp edges. This is obtained because the substrate is inserted parallel to the projecting leg part of the V-shaped leg at a particular angle to the longitudinal direction and is subsequently tilted with lever action on the V-shaped leg, so that this leg is held under tension of the contact face of the substrate. Only a slight force is then needed for sliding on, which is determined only by the friction between contact points of the connector and contact faces on the substrate.

U.S. Pat. No. 3,197,729, which issued July 27, 1965 to J. C. Sarazen, discloses a semi-rivet connector for a flexible ribbon conductor, formed of a connector strip of substantially malleable conductive metal and having a plurality of spread apart pointed tangs or lances, extending from the strip surface. These tangs or lances are formed by a puncturing operation, such that their pointed ends curl outwardly, away from the puncturing axis. When compressed against the flexible ribbon conductor to be connected with, having a relative puncture resistent surface, the pointed ends first penetrate the dielectric layer of the ribbon conductor, but then fold back and spread apart against the metal conductor surface and not cutting this conductor. The metal of these tangs or lances is such malleable, as the strip material, that upon separation of the contact element from the ribbon conductor, the curled pointed ends of the tangs or lances fold back to their original position.

The contact strip of the connector of the present invention is formed however of such solid bend resist material that the outwardly projecting teeth do not curl but cut through the complete flexible cable, also cutting through the electrical conductor thus producing an excellent electrical contact. Only after cutting the complete cable the teeth are deformed and folded backwards in the direction of the strip type base part, thus clamping the contact strip and total flexible cable tightly together, at the same time giving a much better and durable electrical contact between the teeth and the conductor than with the connector disclosed in the aforenoted U.S. Pat. No. 3,197,729.

BRIEF DESCRIPTION OF THE DRAWINGS

The invention will now be explained in greater detail with reference to the examples of embodiments shown in the drawings.

FIG. 10 shows a different embodiment of the contact strip according to FIG. 8, in which the upright lips are provided with sharp, pointed projections;

FIG. 11 shows another preferred embodiment of a contact strip according to the invention for the connection of electronic components or connecting wires to the conductors of a flexible conductor film;

FIG. 12 shows on an enlarged scale a front view of a contact strip according to FIG. 11 connected to a conductor of a flexible conductor film, with the successive positions to be taken up by the lips for connecting wires of various thicknesses being shown in dashed lines;

FIG. 14 is a perspective drawing of another embodiment of a contact strip according to the invention, for example for the connection of conductors of two flexible conductor films placed one above the other;

FIG. 15 is a perspective drawing of another embodiment of a contact strip according to the invention for the connection of electronic components or connecting wires to the conductors of a flexible conductor films;

FIG. 16 is a perspective drawing of yet another embodiment of a contact strip according to the invention, in which the upright lips are provided with sharp, pointed projections;

FIG. 17 is a top view of an edge clip connected with the contact strip in another embodiment of the present invention;

FIGS. 17a and 18b, respectively, show a top view and a side view of the edge clip connector of FIG. 17;

FIG. 19 is a perspective view of a row of edge clip connectors separated from a carrier strip; and FIG. 20 is a perspective view of a row of edge clip connectors plugged on the one end onto a substrate and on the other end to a flexible conductor by means of the contact strip of the present invention.

DESCRIPTION OF THE PREFERRED EMBODIMENTS

Figure 1:
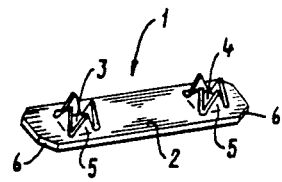
FIG. 1 is a perspective drawing of an embodiment of a contact strip according to the invention for the connection of conductors of a flexible conductor film.

In the embodiment shown in FIG. 1 of the contact strip 1 according to the invention, the electrically conducting strip-type base part 2 of the electrically conducting sheet material comprises a first group 3 and a second group 4 of triangular teeth 5 which are virtually at right angles to a surface of the base part and are outward projecting in the same direction, said groups being displaced relative to each other over a distance in the longitudinal direction of the base part. Unlike those in the above-mentioned U.S. Pat. No. 4,082,402, the teeth are all grouped within the periphery of the strip-type base part. The corners 6 of the base part are bevelled in order to prevent undesired contacts on bending of the flexible conductor film, through the sharp corner points penetrating through the insulation layer of the film. This embodiment is particularly suitable for the interconnection of conductors of the same film.

Figure 2:
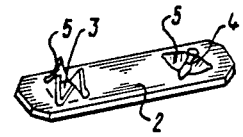
FIG. 2 is a perspective drawing of a different embodiment of a contact strip according to the invention for the connection of conductors of flexible conductor films.

In the embodiment of the contact strip shown in FIG. 2, the teeth of the second group 4 project outwards in the opposite direction to that of the teeth of the first group 3. The contact strip according to this embodiment is particularly suitable, for example, for the interconnection of conductors on opposite sides of a flexible conductor film which is wired on both sides.

Figure 3:
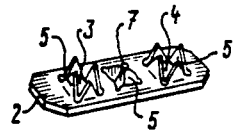
FIG. 3 is a perspective drawing of a preferred embodiment of a contact strip for the connection of conductors of two flexible conductor films placed one above the other.
Figure 4:
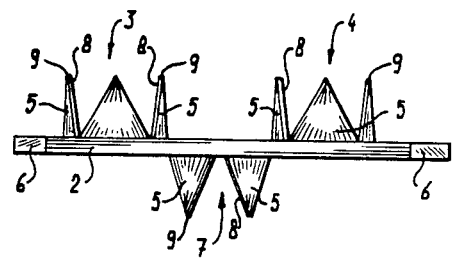
FIG. 4 shows on an enlarged scale a side view of the contact strip of FIG. 3.

In the preferred embodiment of the contact strip according to the invention shown in FIG. 3, provision is made between the first and second group of teeth projecting outwards in the same direction for a third group of teeth 7 projecting outwards in the opposite direction. This side view of the preferred embodiment of FIG. 3 shown on an enlarged scale in FIG. 4 shows clearly the sharp edges 8 and the pointed ends 9 of the individual teeth which can penetrate through the carrier, the conductor and any further insulation layers of the flexible conductor film surrounding the conductor.

Figure 5:
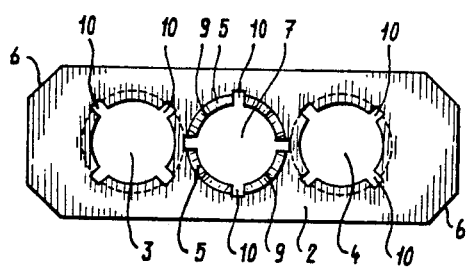
FIG. 5 shows on an enlarged scale the bottom view of the contact strip of FIG. 3.
Figure 6:
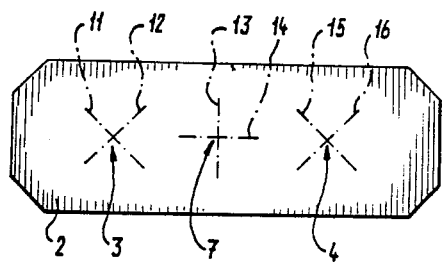
FIG. 6 shows by dashed lines the lines of intersection along which the pointed teeth of the contact strip according to FIG. 3 are punched from the strip of electrically conducting material forming the base part.

In the bottom view of the preferred embodiment of FIG. 3 shown on an enlarged scale in FIG. 5, it can be seen that each group of teeth 3, 4, 7 comprises four individual circular sector-shaped teeth 5, which can be stamped in a simple manner from the contact strip and bent over in a circular sector form if necessary. FIG. 6 shows by dashed lines the lines of intersection 11, 12, 13, 14, 15, 16 of the circle sectors along which the teeth can be stamped. The structural strength of the strip can be increased considerably by selecting the lines of intersection of two adjacent groups of teeth, for example 11, 13 and 12, 14, in such a way that the angle between them is less than 90 degrees. In FIG. 6 this angle is approximately 45 degrees. The recesses 10 (FIG. 5) are for the purpose of preventing tearing of the base part 2 at the ends of the lines of intersection 11, 12, 13, 14, 15, 16 during bending over of the teeth.

When the teeth are formed in this way the radius of the circle bounding the teeth of a group is the determining factor for the height of the teeth, which is connected with the thickness of the flexible conductor film and the number of films possibly lying on top of each other and for which the contact strip can be used with sufficient holding power of the teeth which are bent backwards towards the base part. It will be clear that, instead of a circle, the teeth of a group can be bounded by an ellipse, triangle, square or other geometrical polygon.

Figure 7:
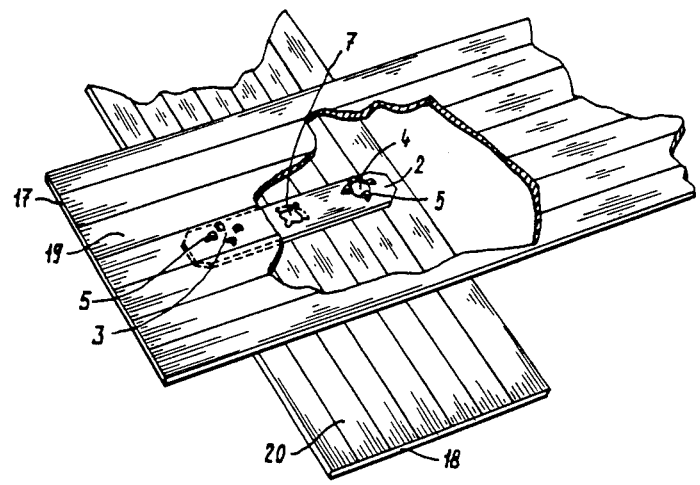
FIG. 7 shows a partially cutaway connection between the conductors of two flexible conductor films for which a contact strip according to FIG. 3 is used.

The manner in which, for example, conductors of conductor films lying on top of one another can be interconnected by means of the contact strip according to the invention is shown in FIG. 7. By means of the contact strip of FIG. 3, conductor 19 of film 17 is here connected to conductor 20 of film 18. Once the teeth 5 have penetrated through the film and the conductor, they are bent backwards in the direction of the base part 2 with the pointed ends 9 facing away from each other, as a result of which the film is pressed against the base part of the contact strip. Contacting of the conductor takes place by means of the sharp edges 8 of the teeth 5. Depending on the force with which the film is pressed by means of the bent-over teeth against the contact strip, contacting of the conductor can also take place by means of the pointed ends 9 of said teeth. However, this is not necessary, so that it will be clear that the contact strip can be fitted both from the conductor side and from the carrier side of the conductor film. The films 17 and 18 are shown perpendicular to each other, but this is not necessary.

The width of the contact strip is preferably chosen equal to or smaller than the width of the conductor to be contacted. The closed peripheral line which bounds the teeth 5 along their ends fixed to the base part must, however, be selected in such a way that the distance btween the teeth of a group is smaller than the smallest dimension of the conductor to be contacted, in order to ensure that the teeth are sufficiently enclosed by conductor material to give a reliable contact. This means that it is possible with the single contact strip according to the invention to interconnect any desired conductors which form any desired angles with each other. The distance between the groups of teeth 3, 4 and 7 can advantageously be selected as full multiple of the common insertion width or distances between the conductors of flexible conductor film. The thickness of the contact strip and the choice of the type of material from which the strip is made determine the strength of the teeth. A condition is that the teeth should have sufficient strength to penetrate through the film and the conductor, but that they should not be so strong that disproportionately great force is required to bend them backwards. Out of a contact strip of a copper alloy, and with a thickness of the order of 0.2 millimeter, it is possible to stamp strong enough teeth which can penetrate through practically all commercially available conductor films, and the teeth can also be deformed by hand.

Figure 8:
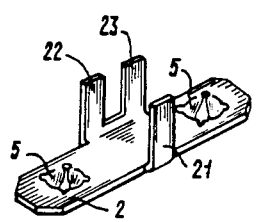
FIG. 8 is a perspective drawing of an embodiment of a contact strip according to the invention for the connection of components or connecting wires to a conductor of a flexible conductor film.
Figure 9:
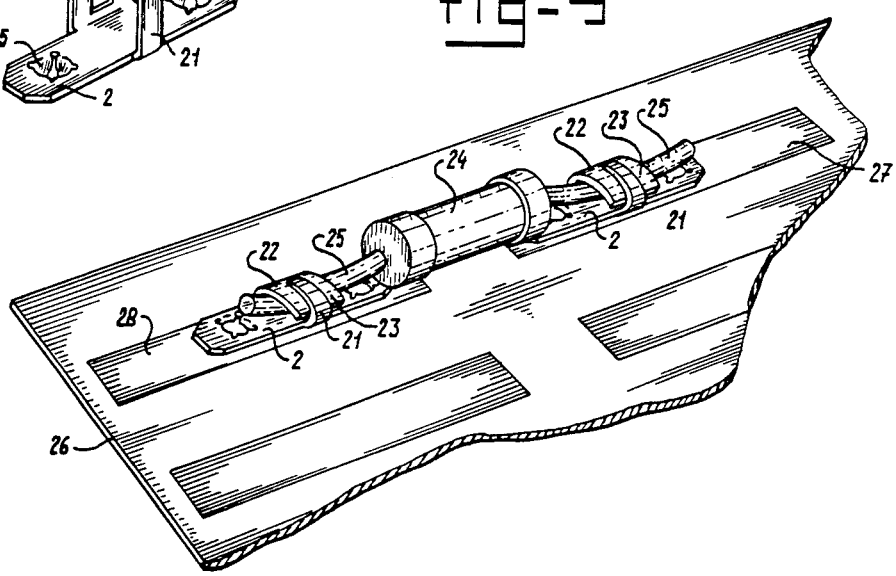
FIG. 9 is a perspective drawing of a flexible conductor film to which a resistor is connected between two conductors by means of the contact strip of FIG. 8.

In addition to the interconnection of conductor of flexible conductor film, another object of the present invention is to produce a contact strip with which electronic components or signal wires can be connected to conductors of a conductor film. As shown in FIG. 8, the contact strip of FIG. 1 is to this end provided on its long sides with lips 21, 22 and 23. These lips project outwards virtually at right angles to the base part 2 and here in the opposite direction relative to the teeth 5. The lips can be bent in such a way towards the base part 2 that the wire to be connected is clamped between the lips and the base part, as shown in FIG. 9. By means of the contact strip according to the invention as shown in FIG. 8, a resistor 24 with connecting wires 25 is clamped herein between two conductors 27, 28 of the flexible conductor film 26. After bending over, the single lip 21 in the centre of one long side of the contact strip and the lips 22, 23 provided in a U-shape on the other long side of the contact strip form a closed face between which the base part 2 of the conductor is held firmly clamped. It will be clear that the electronic components can also be connected at any desired angles to the conductors of a flexible conductor film.

In order to make it possible to accommodate various diameters or tolerances in connecting wires of electronic components without the reliability of the connection being reduced by a poorer clamping action, FIG. 10 shows an embodiment of the contact strip of FIG. 8 in which the lips are provided with sharp, pointed projections or elevations 29 which, after bending over of the lips, point towards the base part 2. These projections or elevations 29 can bite into the connecting wire 25, which means that for various wire cross sections a good, sturdy clamping action is achieved, without any insulation layer round the connecting wire having to be removed.

Another preferred embodiment of a contact strip according to the invention for the connection of wires of differing diameters is shown in FIG. 11. This is essentially the contact strip of FIG. 3, in which the lips 21, 22 and 23 now project outwards in the same direction as the third group of teeth 7. Through the bending over of the lips, the connecting wire is pressed between the teeth 30 (sic), and the sharp edges 8 can bite into the conductor, thereby achieving a firm clamping action, also without insulation having to to be removed.

FIG. 12 shows the position between the teeth for wires with varying diameters 30, 31. The lips 32, 33 in this embodiment are bent inwards on the top side, as a result of which they make a better connection with the round shape of the connecting wires 30, 31 to be connected. It can also be seen how the teeth 5 on the underside of the contact strip are pressed through the conductor 28 and the film 26 and backwards in the direction of the base part 2, when the pointed ends 7 are pressed into the carrier of the film 26.

It will be clear that one or more lips in the embodiment shown in FIG. 11 can also be provided with sharp, pointed projections 29.

The contact strips according to the invention are particularly suitable for automatic positioning on a conductor film. For such mechanical working, it is advantageous to produce the individual contact strips in a connected row, for example by stamping them out of an elongated strip of conducting material.

Figure 13A:
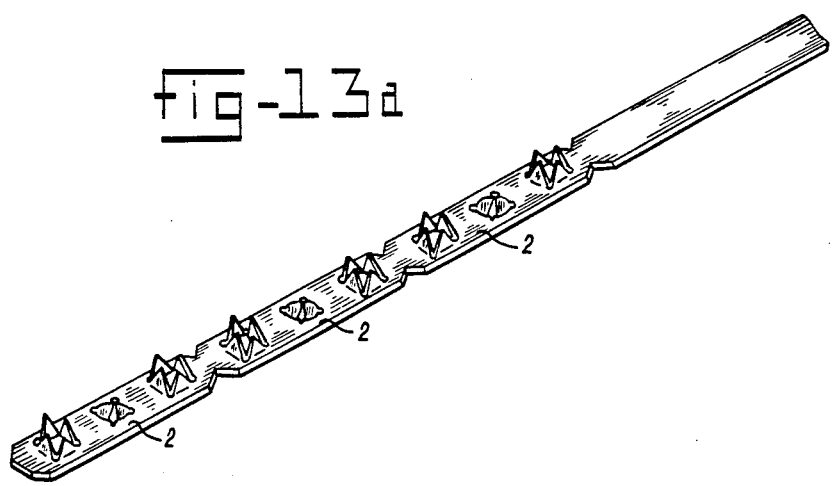
FIGS. 13a and 13b show a continuous series of contact strips according to FIG. 3 and FIG. 8, respectively, suitable for mechanical processing thereof.
Figure 13B:
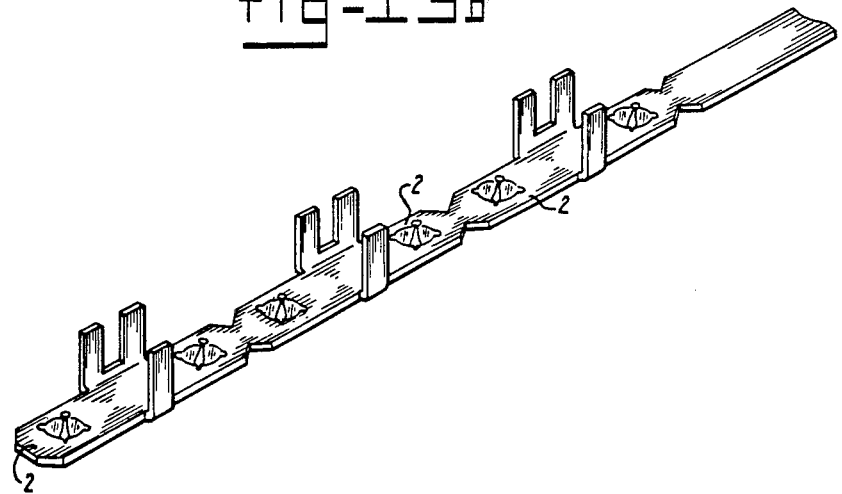

FIG. 13a shows such a row of contact strips according to FIG. 3, and 13b such a row of contact strips according to FIG. 8. If the processing machine is provided with a rotating insertion head, the contact strips can be placed at various angles to each other and to the conductors of the conductor film over the entire surface thereof; in particular, when the film is placed on a so-called X-Y table, which can, for example, be moved under this insertion head under the control of a computer program.

FIG. 14 shows another advantageous embodiment with teeth projecting in the opposite direction to that of the base part, for the connection of conductors of conductor films lying one above the other. FIG. 15 shows a further advantageous embodiment of a contact strip, based on the contact strip of FIG. 14, with upright lips for the connection of electronic components or connecting wires to the conductors of a flexible conductor film.

FIG. 16 shows an advantageous embodiment of a contact strip for the connection of electronic components or connecting wires, but where the upright lips are provided with sharp, pointed projections or elevations. One or more lips of the contact strip shown in FIG. 15 can also be provided with similar pointed projections.

FIG. 17-20 show another useful application of the contact strip of the present invention, having as a further connecting means a particular loop strip contact for connecting a flat flexible conductor with a substrate or printed circuit board.

In FIG. 17 the reference number 34 indicates the stem strip and 1 the contact strip having prestamped teeth 5 as in FIG. 1 for instance. The closed flat loop strip is generally indicated by 35, whilst 36 and 37 indicate the respective legs thereof. After bending of this flat loop about the centre transverse axis 38 (FIG. 18b) an approximately U-shaped clip contact is obtained.

FIG. 18a shows a top view and FIG. 18b a side view of two clip contacts with contact strip. It can be seen clearly from FIG. 18a how the edge clip connector projects crosswise from a carrier strip 39. From the carrier 39 runs a contact strip 1, which passes into the stem strip 34, as shown in FIG. 17. The stem strip comprises at the end the closed flat loop strip 35, which is bent about the centre axis 38 as shown in FIG. 18b. It is also indicated that in the process for producing this edge clip connector the stem strip 34 with the edge clip contact 35 is bent perpendicularly with respect to the contact strip 1.

FIG. 18b shows that the leg 37 of each half of the loop through the stamping operation has a slight V-shape with leg parts 37.1 and 37.2, the top of which V-shape is directed inwards, and that the leg 36 of each half of the loop has a meander shape with at least two inward-directed supporting bracket points 36.1 and 36.2.

This shape of the two halves of the loop is selected in such a way that substrates which currently are made of glass and are consequently very sharp can be pushed easily at an angle into the clip connector opening, in such a way that it is inserted parallel to the leg part 37.2 until the edge of the substrate comes to rest in the bend between the contact points 36.1 and 36.2. If the substrate is then tilted so that the contact leg 37 is under tension on the contact face of the substrate, this substrate can be pushed in.

The edge clip connector 35 comprises at its extension contact-strip 1 projecting teeth 5 for connection of the clip connector 10 to a flexible foil or flexible conductor.

FIG. 19 gives a perspective view of a row of edge clip connectors which are already separated from the carrier strip 39.

FIG. 20 shows how such a row of edge clip connectors is plugged to a substrate 26 contacting the contact faces 40 thereof. The contact strips 1 are connected to a flexible circuit or a flexible conductor, as described above by beating the teeth 5 through the contact strip 18 of the flexible circuit.

FIG. 20 is a perspective view of a row edge clip connectors plugged onto a substrate.

For the production of edge clip connectors initially fixed to a carrier strip one starts from a flat sheet or strip of resilient metal, from which with the aid of stamping equipment a carrier strip is stamped with stem strips which project crosswise therefrom and each pass into a closed flat loop strip. The thus stamped-out projecting parts constitute a preform from which the final edge clip connectors are formed.

It will be clear that further modifications and additions, for example in the shape, the quantity and the placing of the teeth per contact strip, the shape of the base part and the quantity and position of the lips for clamping a connecting wire, are possible without going beyond the scope of the invention.

I claim:

1. A contact strip terminal for electrically interconnecting a flat, flexible conductor film and a conductor lead wire, said contact strip terminal comprising:
    a flat, strip-like base formed of electrically conductive material, said base having first and second surfaces and first and second longitudinal edges,
    a first group of teeth formed integrally with and projecting from the first surface of the base, said first group of teeth being adapted to pierce into the flexible conductor film and electrically contact one of the conductors in said film,
    a second group of teeth formed integrally with and projecting from the second surface of the base in a direction opposite to the first group of teeth, and
    at least one lip-like member projecting from the first longitudinal edge of the base in the same direction as said second group of teeth, said lip-like member being deformable in the direction of the base for clamping said conductor lead wire between said lip-like member and said base.

2. A contact strip terminal according to claim 1, further comprising a third group of teeth projecting from said first surface of the base in the same direction as said first group of teeth, said second group of teeth being disposed between said first and third groups of teeth.

3. An edge clip connector for interconnecting the contact strip terminal of claim 1 with contact faces near the edge of a substrate, said connect or comprising an assembly obtained in one stamping operation from a flat sheet of resilient metal and comprising said contact strip terminal, a stem strip and a clip contact in the form of a closed flat loop strip which at one end passes into the stem strip and which is bent about the symmetrical transverse axis, so that the legs of the two halves of the loop come to rest adjacent to each other and together define an approximately U-shaped clip opening on either side.

4. A process for the production of one or more edge clip connectors according to claim 3 in which the edge clip connectors are stamped out of a flat sheet of resilient metal and by means of a stem strip are held firmly on a carrier strip made from the sheet, while after the stamping operation the closed flat loop strip thus obtained is bent about the symmetrical transverse axis, and the stem strip with its clip contact is bent over at right angles relative to the contact strip terminal.

5. An edge clip connector according to claim 3 wherein one leg of each half of the loop is a meander shape with at least two inward-directed supporting bracket contact points, and the other leg is a slight V-shape, whose top is directed inwards and opposite the bend lying between the two supporting bracket contact points of the one leg, so that the substrate in question can be inserted parallel to the outward-projecting leg part of the other leg at an angle to the longitudinal direction of the clip contact until its edge lies in the said bend of the one leg and subsequently can be introduced with lever action on the V-shape of the other leg along the longitudinal direction up to the closed end of the two halves of the loop.

6. An edge clip connector according to claim 5 wherein the contact strip terminal is perpendicularly bent with respect to the longitudinal axis of the edge clip connector for interconnection with a separate flexible conductor.

7. A contact strip terminal according to claim 1, further comprising second and third lip-like members projecting from the second longitudinal edge of the base in the same direction as and opposite to said first lip-like member, said second and third lip-like members also being deformable in the direction of the base to interdigitate with said first lip-like member in clamping said conductor lead wire to said base.

8. A contact strip terminal according to claim 7, wherein said lip-like members are disposed adjacent to said second group of teeth so that when said members are deformed to clamp the conductor lead wire to the base the teeth of said second group will electrically contact the conductor lead wire.

9. A contact strip terminal according to claim 7, wherein at least one of said lip-like members has several sharp pointed projections which electrically contact the conductor lead wire when it is clamped by said lip-like members.

10. A contact strip terminal according to claim 1, wherein the teeth of each said group are provided with sharp edges and are arranged in a closed peripheral line.

11. A contact strip terminal according to claim 10, wherein each said group of teeth comprises four pointed, triangular shaped teeth arranged in a circle.

* * * * *